United States Patent
Chu et al.

(10) Patent No.: US 9,891,500 B1
(45) Date of Patent: Feb. 13, 2018

(54) SYSTEMS AND METHODS FOR OPTICAL FREQUENCY COMB GENERATION USING A MICRORING RESONATOR

(71) Applicant: City University of Hong Kong, Kowloon (HK)

(72) Inventors: Sai Tak Chu, Kowloon (HK); Kun Zhu, Sha Tin (HK)

(73) Assignee: City University of Hong Kong, Kowloon (HK)

( * ) Notice: Subject to any disclaimer, the term of this patent is extended or adjusted under 35 U.S.C. 154(b) by 0 days.

(21) Appl. No.: 15/399,321

(22) Filed: Jan. 5, 2017

(51) Int. Cl.
| | |
|---|---|
| G02F 1/35 | (2006.01) |
| G02F 1/365 | (2006.01) |
| H01S 3/067 | (2006.01) |
| H01S 3/08 | (2006.01) |
| H01S 5/50 | (2006.01) |

(Continued)

(52) U.S. Cl.
CPC ............ *G02F 1/3536* (2013.01); *G02F 1/365* (2013.01); *H01S 3/067* (2013.01); *H01S 3/06791* (2013.01); *H01S 3/08013* (2013.01); *H01S 5/0092* (2013.01); *H01S 5/06821* (2013.01); *H01S 5/5054* (2013.01);
(Continued)

(58) Field of Classification Search
CPC .............. G02F 1/3536; G02F 2203/15; G02F 2203/56; H01S 3/08013; H01S 5/5054
See application file for complete search history.

(56) References Cited

U.S. PATENT DOCUMENTS 5,363,192 A * 11/1994 Diels .................. G01C 19/66
356/461
6,201,638 B1  3/2001 Hall et al.
(Continued)

FOREIGN PATENT DOCUMENTS

| CN | 101846861 A | 9/2010 |
| CN | 103631036 A | 3/2014 |

(Continued)

OTHER PUBLICATIONS

Peccianti, M. et al. Demonstration of a Stable Ultrafast Laser Based on a Nonlinear Microcavity, Nature Communications 3, 765 (2012), 6 pages.

(Continued)

*Primary Examiner* — Daniel Petrovsek
(74) *Attorney, Agent, or Firm* — Norton Rose Fulbright US LLP

(57) ABSTRACT

Systems and methods which provide for the generation of optical frequency combs using a microring resonator optical frequency comb generator configuration are described. A microring resonator optical frequency comb generator configuration of embodiments comprises a plurality of fiber loop laser cavities and at least one microring cavity are utilized. For example, an optical frequency comb generator may include a first fiber loop laser cavity, a second fiber loop laser cavity that is symmetrical with the first fiber loop laser cavity, and a microring resonator that is coupled into both of the first and second fiber loop laser cavities. The microring resonator may be configured to provide a high quality factor, Q, value. The microring resonator of embodiments works together with optical bandpass filters and amplifiers in the multiple fiber loops to make the generated optical frequency comb stable and flexible.

32 Claims, 5 Drawing Sheets

(51) Int. Cl.
*H01S 5/068* (2006.01)
*H01S 5/00* (2006.01)

(52) U.S. Cl.
CPC ...... *G02F 2201/02* (2013.01); *G02F 2203/15* (2013.01); *G02F 2203/56* (2013.01); *G02F 2203/70* (2013.01)

(56) References Cited

U.S. PATENT DOCUMENTS

| | | | |
|---|---|---|---|
| 6,473,218 | B1 | 10/2002 | Maleki et al. |
| 6,591,026 | B2 | 7/2003 | Endo et al. |
| 6,924,924 | B2 | 8/2005 | Fujiwara et al. |
| 7,050,212 | B2 | 5/2006 | Matsko et al. |
| 7,123,800 | B2 * | 10/2006 | Kaplan ............... G02B 6/12007 385/32 |
| 7,203,402 | B2 | 4/2007 | Haensch et al. |
| 7,239,442 | B2 | 7/2007 | Kourog et al. |
| 7,460,746 | B2 | 12/2008 | Maleki et al. |
| 7,982,944 | B2 * | 7/2011 | Kippenberg ............... G02F 1/39 359/245 |
| 8,023,775 | B2 | 9/2011 | Sakamoto et al. |
| 8,111,722 | B1 | 2/2012 | Maleki et al. |
| 8,120,841 | B2 | 2/2012 | Sosabowski et al. |
| 8,416,819 | B2 | 4/2013 | Grebing et al. |
| 8,447,155 | B1 | 5/2013 | Kuo et al. |
| 8,519,803 | B2 | 8/2013 | McLaren et al. |
| 8,571,075 | B2 | 10/2013 | Fermann et al. |
| 8,760,752 | B2 | 6/2014 | Chen et al. |
| 8,792,525 | B2 | 7/2014 | Fermann et al. |
| 8,917,444 | B2 | 12/2014 | Li et al. |
| 8,982,450 | B2 | 3/2015 | Cox et al. |
| 9,140,959 | B2 * | 9/2015 | Kieu ........................ G02F 1/395 |
| 9,195,113 | B2 | 11/2015 | Cox |
| 9,244,330 | B2 | 1/2016 | Kuo |
| 9,490,605 | B2 * | 11/2016 | Gaeta .................. H01S 3/06791 |
| 2004/0100675 | A1 * | 5/2004 | Matsko ................. H01S 3/0627 359/245 |
| 2014/0253915 | A1 | 9/2014 | Ataie et al. |
| 2015/0325978 | A1 | 11/2015 | Fertig et al. |

FOREIGN PATENT DOCUMENTS

| | | |
|---|---|---|
| CN | 103744249 A | 4/2014 |
| EP | 1988425 A1 | 11/2008 |
| WO | WO-2004042881 A2 | 5/2004 |
| WO | WO-2004107033 A1 | 12/2004 |
| WO | WO-2007148056 A1 | 12/2007 |
| WO | WO-2014131425 A1 | 9/2014 |
| WO | WO-2015012915 A2 | 1/2015 |

OTHER PUBLICATIONS

Razzari, L. et al. CMOS-Compatible Integrated Optical Hyper-Parametric Oscillator, Nature Photonics 4, 41-45(2010), 5 pages.
Pasquazi, A. et al. Self-Locked Optical Parametric Oscillation in a CMOS Compatible Microring Resonator: A Route to Robust Optical Frequency Comb Generation on a Chip, Optical Express 11, 13333-13341 (2013), 9 pages.
Pasquazi, A. et al. Stable, Dual Mode, High Repetition Rate Mode-Locked Laser Based on a Microring Resonator, Opt. Express 20, 27355-27362 (2012), 8 pages.
Duchesne, D. et al. Efficient Self-Phase Modulation in Low Loss, High Index Doped Silica Glass Integrated Waveguides, Optics Express 17, 1865-1870 (2009), 6 pages.
Ferrera, M. et al. Low-Power Continuous-Wave Nonlinear Optics in Doped Silica Glass Integrated Waveguide Structures, Nature Photonics 2, 737-740 (2008), 4 pages.
Moss, D. et al. New CMOS-Compatible Platforms Based on Silicon Nitride and Hydex for Nonlinear Optics, Nature Photonics 7, 597-607 (2013), 11 pages.
Little, B.E. et al. Microring Resonator Channel Dropping Filters, Journal of Lightwave Technology 15, 998-1005 (1997), 8 pages.
Saha, K. et al. Modelocking and Femtosecond Pulse Generation in Chip-Based Frequency Combs, Optics Express 21, 1335-1343 (2013), 9 pages.
Kippenberg, T.J. et al. Microresonator-Based Optical Frequency Combs, Science 332, 555-559 (2011), 5 pages.
Del'Haye, P. et al. Full Stabilization of a Microresonator-Based Optical Frequency Comb, Physical Review Letters 101, 053903 (2008), 4 pages.
Pfeifle, J. et al. Coherent Terabit Communications with Microresonator Kerr Frequency Combs, Nature Photonics 8, (2014), 11 pages.
Victor Torres Company and Andrew M. Weiner, Optical Frequency Comb Technology for Ultra-Broadband Radio-Frequency Photonics, Laser Photonics Rev. 8, (2014), 55 pages.
Newbury, Nathan R. Searching for Applications with a Fine-Tooth Comb, Nature Photonics 5, 186-188 (2011), 3 pages.
Delfyett, Peter J. et al. Optical Frequency Combs From Semiconductor Lasers and Applications in Ultrawideband Signal Processing and Communications, Journal of Lightwave Technology 24, 2701-2719 (2006), 19 pages.
Levy, Jacob S. et al. CMOS-Compatible Multiple-Wavelength Oscillator for On-Chip Optical Interconnects, Nature Photonics 4, 37-40 (2010), 4 pages.
Jiang, Z. et al. Optical Arbitrary Waveform Processing of More Than 100 Spectral Comb Lines, Nature Photonics 1, 463-467 (2007), 5 pages.
Ferdous, F. et al. Spectral Line-By-Line Pulse Shaping of an On-Chip Microresonator Frequency Combs, Nature Photonics 5, (2011), 18 pages.
Fortier, T.M. et al. Generation of Ultrastable Microwaves Via Optical Frequency Division, Nature Photonics 5, (2011), 22 pages.
Washburn, Brian R. et al. Phase-Locked, Erbium-Fiber-Laser-Based Frequency Comb in the Near Infrared, Optics Letters 29, 250-252 (2004), 3 pages.
Steinmetz, T. et al. Laser Frequency Combs for Astronomical Observations, Science 321, (2008), 18 pages.
Foster, M.A. et al. Silicon-Based Monolithic Optical Frequency Comb Source, Optical Express 19, 14233-14239 (2011), 7 pages.
Herr, T. et al. Universal Formation Dynamics and Noise of Kerr-Frequency Combs in Microresonators, Nature Photonics 6, (2012), 8 pages.
Jung, H. et al. Optical Frequency Comb Generation From Aluminum Nitride Micro-Ring Resonator, Optics Letters 38, (2013), 4 pages.
Hausmann, B. J. M. et al. Diamond Nonlinear Photonics, Nature Photonics 8, 369-374 (2014), 6 pages.
Savchenkov, A. A. et al. Kerr Frequency Comb Generation in Overmoded Resonators, Optical Express 24, 27290-27298 (2012), 9 pages.
Savchenkov, A. A. et al. Optical Combs With a Crystalline Whispering Gallery Mode Resonator, Physical Review Letters 101, 093902 (2008), 4 pages.
Xue, X. et al. Mode-Locked Microresonator Combs in the Normal Dispersion Region, Advanced Photonics© 2015 OSA, IT3B.3, 3 pages.
Antikainen, A. et al. Dual-Pump Frequency Comb Generation in Normally Dispersive Optical Fibers, Journal of the Opical Society of America B 32, 1705-1711 (2015), 7 pages.
Okawachi, Y. et al. Dual-Pumped Degenerate Kerr Oscillator in a Silicon Nitride Microresonator, Optical Letters 40, (2015), 5 pages
Izhaky, N. et al. Development of CMOS-Compatible Integrated Silicon Photonics Devices, IEEE Journal of Selected Topics in Quantum Electronics 12, 1688-1698 (2006), 11 pages.
Absil, P.P. et al. Wavelength Conversion in GaAs Micro-ring Resonators, Optics Letters 25, 554-556 (2000), 3 pages.
Yoshida, E. et al. Low-Threshold 115-GHz Continuous-Wave Modulational-Instability Erbium-Doped Fiber Laser, Optics Letter 22, 1409-1411 (1997), 3 pages.
Huang, T. et al. All-Fiber Multiwavelength Thulium-Doped Laser Assisted by Four-Wave Mixing in Highly Germania-Doped Fiber. Optical Express 23, 340-348 (2015), 9 pages.

(56) References Cited

OTHER PUBLICATIONS

Wang, P. et al. Multi-Wavelength Erbium-Doped Fiber Laser Based on Four-Wave-Mixing Effect in Single Mode Fiber and High Nonlinear Fiber. Optical Express 21, 12570-12578 (2015), 9 pages.

* cited by examiner

SYSTEMS AND METHODS FOR OPTICAL FREQUENCY COMB GENERATION USING A MICRORING RESONATOR

TECHNICAL FIELD

The invention relates generally to the generation of optical frequency combs and, more particularly, to generation of high-quality optical frequency combs using a microring resonator optical frequency comb generator configuration.

BACKGROUND OF THE INVENTION

A frequency comb is a spectrum consisting of a series of discrete, equally spaced elements. The frequency domain representation of a perfect frequency comb is a series of delta functions spaced as $f(n)=f_0+nf_r$, where n is an integer, $f_r$ is the comb tooth spacing, and $f_0$ is the carrier offset frequency ($f_0 < f_r$). Such a frequency comb facilitates a direct link from radio frequency standards to optical frequencies and may be useful with respect to a number of different applications, such as spectroscopy, coherent optical communications, and microwave photonics.

A variety of different methods for optical frequency comb generation have been proposed. The existing technologies for the generation of optical frequency combs can be generally classified into three types of generators: Optical frequency comb generators based on femtosecond mode-locked laser; Optical frequency comb generators based on electro-optic modulator (EOM); and Optical frequency comb generators based on $3^{rd}$-order nonlinear Kerr effect in micro-cavities. In operation of the optical frequency comb generators based on the conventional femtosecond mode locked lasers, the frequency spacing of the generated optical frequency comb is quite limited by the laser cavity length (i.e., limited to approximately 10 GHz). Although the frequency spacing can be extended to tens of GHz in operation of the optical frequency comb generators based on EOM, the frequency spacing is nevertheless limited by the bandwidth of the EOMs and RF oscillators. In operation of the prior optical frequency comb generators based on nonlinear Kerr effect of micro-cavities, the frequency spacing of the generated comb can be expanded to hundreds of GHz, however these optical frequency comb generators typically require strict wavelength matching and thermal stabilization when external direct laser pumping or one fiber loop laser cavity is used.

As can be appreciated from the foregoing, prior optical frequency generators show non-ideal performance of the small frequency spacing and narrow spectrum bandwidth. Such traditional optical frequency comb generation techniques are not well suited to meet needs for larger frequency spacing and broader spectrum bandwidth. Moreover, most of the traditional techniques for optical frequency comb generation lack flexibility, for which the frequency spacing and the shape of the generated comb cannot been changed easily.

BRIEF SUMMARY OF THE INVENTION

The present invention is directed to systems and methods which provide for the generation of optical frequency combs using a microring resonator optical frequency comb generator configuration. Such a microring resonator optical frequency comb generator configuration of embodiments provides for the generation of high-quality optical frequency combs. Moreover, tunable broadband optical frequency combs with good flexibility can be generated simply and cost-effectively by embodiments of a microring resonator optical frequency comb generator herein. Implementations of a microring resonator optical frequency comb generator in accordance with concepts of the present invention may be applied in numerous areas of applications, such as ultrafast accurate optical clocks, molecular and biological spectroscopy, astronomy, coherent optical communications, microwave photonics, signal processing in different domains, etc.

In accordance with a microring resonator optical frequency comb generator configuration of embodiments of the invention, a plurality of fiber loop laser cavities and at least one microring cavity are utilized. For example, an optical frequency comb generator of embodiments includes a first fiber loop laser cavity, a second fiber loop laser cavity that is symmetrical with the first fiber loop laser cavity, and a microring resonator that is coupled into both of the first and second fiber loop laser cavities. Such a multiple cavity configuration (e.g., including both kinds of fiber loop laser cavities and a microring cavity) may be utilized to induce and enhance the nonlinear interactions in order to generate the broadband optical frequency comb. For example, in operation according to embodiments laser light from both of the first and second fiber loop laser cavities can be stored in the microring resonator to cause the four wave mixing (FWM) effect to generate the optical frequency combs.

An exemplary embodiment of a microring resonator optical frequency comb generator comprises a microring resonator with a quality factor, Q, value of more than one million acting as both a fine filter and nonlinear element. For example, the microring resonator of embodiments may be implemented as a CMOS-compatible on-chip microring resonator. The CMOS-compatible characteristics of such a microring resonator facilitates an optical frequency comb generator implementation that is compact and power-efficient, such as may be desirable for mass production.

In operation according to embodiments, the microring resonator of a microring resonator optical frequency comb generator works together with other optical bandpass filters and amplifiers in multiple fiber loops to make the generated optical frequency comb stable and flexible. Such microring resonator optical frequency comb generator configurations may generate optical frequency combs having relatively large frequency spacing and/or having relatively broad spectrum bandwidth according to embodiments herein. Moreover, the wavelength channel spacing can be changed from tens to hundreds GHz discretely according to the parameters of the microring and optical bandpass filters of the microring resonator optical frequency comb generator of embodiments. Further, the shape of the generated optical frequency comb provided by the microring resonator optical frequency comb generator of embodiments may be adjusted when optical bandpass filters with different passbands are used.

As can be appreciated from the foregoing, strict wavelength matching and thermal stabilization are not necessary in microring resonator optical frequency comb generator implementations provided in accordance with concepts of the present invention. Moreover, in microring resonator optical frequency comb generator implementations provided in accordance with concepts of the present invention, the power from the optical amplifiers can also be reduced.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWING

For a more complete understanding of the present invention, reference is now made to the following descriptions taken in conjunction with the accompanying drawing, in which.

DETAILED DESCRIPTION OF THE INVENTION

A microring resonator optical frequency comb generator provided according to concepts of the present invention is adapted provides a convenient and cost-effective solution for the broadband optical frequency comb generation with large and tunable frequency spacing using a configuration including a plurality of fiber loop laser cavities and at least one microring cavity. For example, an optical frequency comb generator of embodiments includes a first fiber loop laser cavity, a second fiber loop laser cavity, and a microring resonator that is coupled into both of the first and second fiber loop laser cavities. Such a microring resonator optical frequency comb generator configuration implemented according to embodiments herein provides a convenient and cost-effective solution for broadband optical frequency comb generation with large and tunable frequency spacing.

Figure 1A:
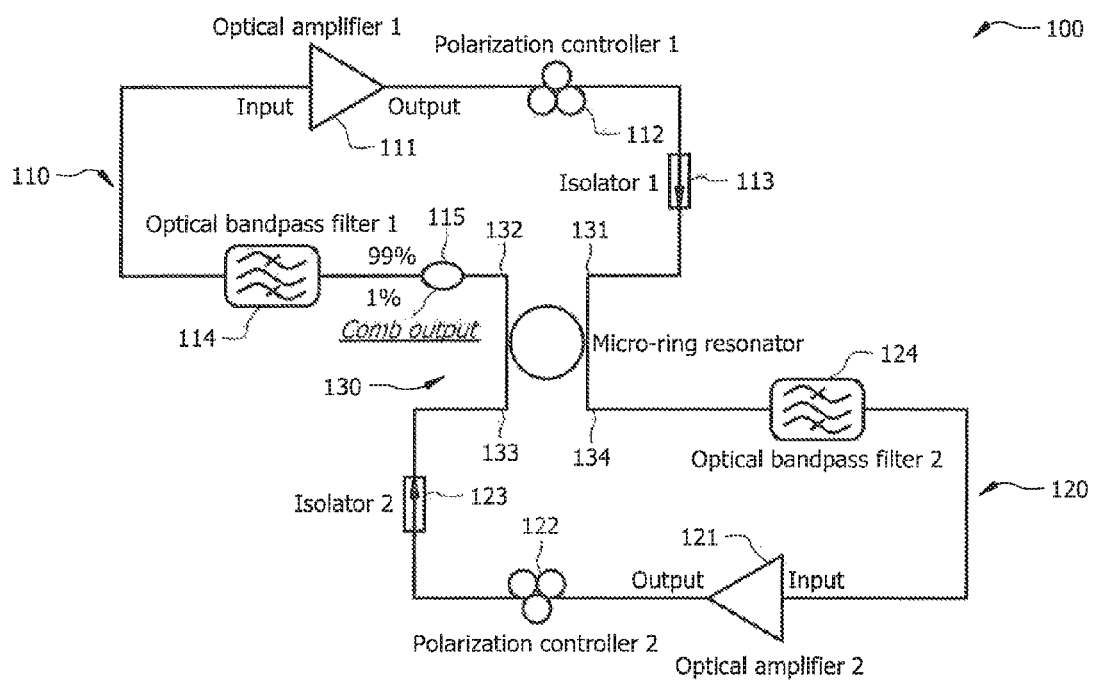
FIG. 1A shows a microring resonator optical frequency comb generator configuration according to embodiments of the present invention.

Directing attention to FIG. 1A, an exemplary embodiment of a microring resonator optical frequency comb generator is shown as microring resonator optical frequency comb generator 100. In the illustrated embodiment of microring resonator optical frequency comb generator 100, two fiber loop laser cavities (e.g., fiber loop laser cavities 110 and 120) are coupled to a microring resonator (e.g., microring resonator 130) to provide generation of optical frequency combs according to the concepts of the present invention. It should be appreciated that microring resonator optical frequency comb generator 100 illustrated in FIG. 1A does not utilize external direct laser pumping, but instead is configured to generate frequency comb without the use of laser light source. As will be better understood from the description of embodiments below, the structure of the illustrated microring resonator optical frequency comb generator is a closed system that avoids instability requiring strict wavelength matching and thermal stabilization.

Fiber loop laser cavities 110 and 120 of embodiments provide optoelectronic oscillators facilitating the generation of frequency elements of a frequency comb. Accordingly, the illustrated embodiments of fiber loop laser cavities 110 and 120 each comprise an optical amplifier (e.g., optical amplifiers 111 and 121) to provide the sustained energy in the cavity, a polarization controller (e.g., polarization controllers 112 and 122) to adjust the polarization state into the microring resonator, an isolator (e.g., isolators 113 and 123) to ensure lightwave propagating in the same direction, and an optical bandpass filter (e.g., optical bandpass filters 114 and 124) to select the resonating modes of the microring resonator and thus the lasing mode of the fiber loop laser cavities. Embodiments of fiber loop laser cavities 110 and 120 may be implemented using optical fibers (e.g., optical fibers made from silica or plastic) or may be integrated onto the planar lightwave circuits. Various components (e.g., optical amplifiers 111 and 121, isolators 113 and 123, and polarization controllers 112 and 122) of fiber loop laser cavities 110 and 120 of embodiments may, for example, be monolithically or hybrid integrated onto the fiber loop laser cavities.

Figure 1B:
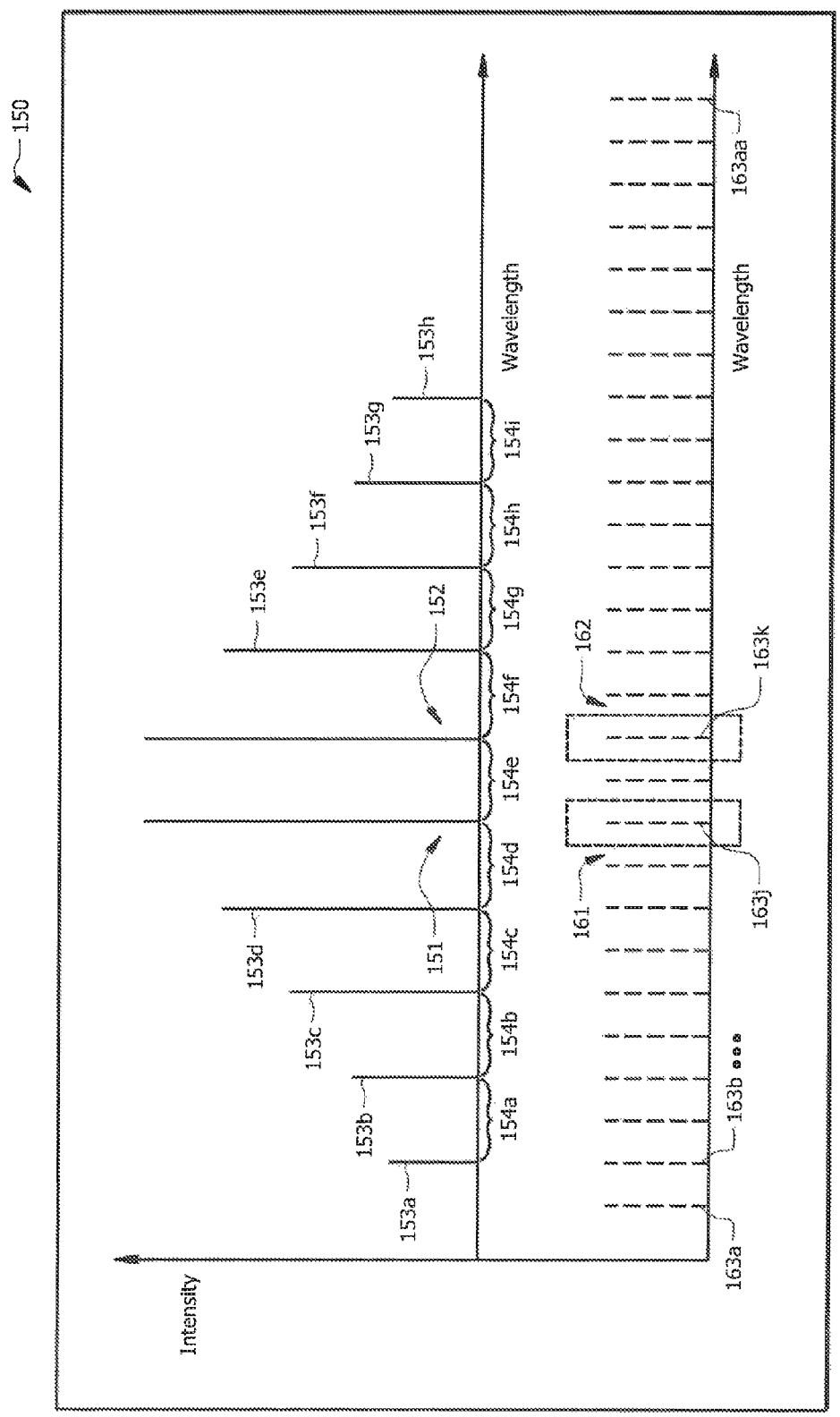
FIG. 1B shows an example frequency comb generated by a microring resonator optical frequency comb generator as shown in FIG. 1A.

In operation, each of the foregoing fiber loop laser cavities provides generation of one or more wavelengths of laser light (e.g., frequency element 151 generated by fiber loop laser cavity 110 and frequency element 152 generated by fiber loop laser cavity 120 shown in FIG. 1B). For example, considering either one of the fiber loops (i.e., fiber loop laser cavity 110 or 120) individually, the fiber loop is a fiber ring laser having lasing modes selected by the optical bandpass filter and microring resonator in the fiber loop. When the two fiber loops (i.e., fiber loop laser cavities 110 and 120) are connected in the illustrated configuration including microring resonator 130, additional wavelengths (e.g., frequency elements 153a-153h) spaced at equal frequency intervals (e.g., channel spacing intervals 154a-154i) are generated from four wave mixing in the microring resonator from the two groups of lasing modes from the two fiber loops to provide a frequency comb (e.g., frequency comb 150 shown in FIG. 1B).

As can be appreciated from the embodiment illustrated in FIG. 1A, fiber loop laser cavities 110 and 120 of a microring resonator optical frequency comb generator herein may comprise similarly configured circuits (e.g., including the same or substantially the same components). For example, fiber loop laser cavities 110 and 120 of an embodiment may comprise the same active components disposed in a same configuration, with the exception that the fiber loop laser cavity 110 includes an optical coupler tap that is not included in fiber loop laser cavity 120, to thereby provide substantially symmetrical configuration of fiber loop laser cavities. The fiber loop laser cavities of a microring resonator optical frequency comb generator of embodiments are similar so that suitable harmonic beat generation and strong FWM may be provided to generate a wider optical frequency comb in accordance with concepts herein. It should be appreciated that, although the circuits of the fiber loop laser cavities of embodiments may be similar, the characteristics of the components of each fiber loop laser cavity may not be identical. For example, the passband of optical bandpass filters 114 and 124 may be different so as to provide for generation of laser light of different wavelengths by each of the fiber loop laser cavities. Additionally or alternatively, either or both of the fiber loop laser cavities of embodiments may comprise one or more component not present in the other fiber loop laser cavity (e.g., optical coupler 115 of fiber loop laser cavity 110 of the illustrated embodiment).

Microring resonator 130 of embodiments provides a high Q factor fiber ring resonator operable in cooperation with fiber loop laser cavities 110 and 120 to facilitate the generation of frequency elements of the frequency comb. For example, microring resonator 130 of embodiments is made from high-index doped silica glass with a Q value of more than one million. Microring resonator 130 may, for example, be configured to have high optical confinement, high index contrast, and low propagation loss to provide a suitably high Q value. Further information regarding configuration of a microring resonator for high Q values can be found in L. Razzari, D. Duchesne, M. Ferrera, R. Morandotti, S. Chu, B. E. Little, and D. J. Moss, "CMOS-compatible integrated optical hyper-parametric oscillator," Nature Photonics 4, 41-45 (2010), the disclosure of which is incorporated herein by reference.

A microring resonator configuration of embodiments may be implemented an integrated optical device that is fabricated using the conventional semiconductor complementary metal-oxide-semiconductor (CMOS) tools and process. Accordingly, microring resonator optical frequency comb generator 100 of embodiments may comprise a CMOS-compatible on-chip microring resonator implementation. Such an on-chip microring resonator implementation of embodiments of microring resonator optical frequency comb generator 100 may not include fiber loop laser cavities 110 and 120 disposed on the same chip as microring resonator 130. However, alternative embodiments of an on-chip microring resonator implementation may include fiber loop laser cavities 110 and 120 disposed on the same chip as microring resonator 130.

Microring resonator 130 of embodiments may, for example, comprise two identical couplers, two half-circle connectors, and four terminals (e.g., terminals 131-134) coupled to fiber loop laser cavities 110 and 120. In operation of microring resonator 130 of such an embodiment, multiple wavelengths input into terminal 131 by fiber loop laser cavity 110 will be partially coupled into the ring through a first coupler. The optical wave in the ring of microring resonator 130 will be partially coupled into a straight waveguide through a second coupler and output from terminal 132 into fiber loop laser cavity 110. Similarly, multiple wavelengths input into terminal 133 by fiber loop laser cavity 120 will be partially coupled into the ring through the second coupler, the optical wave in the ring will be partially coupled into a straight waveguide through the first coupler and output from terminal 134 into fiber loop laser cavity 120. The multiple cavity configuration of microring resonator optical frequency comb generator 100 may thus utilize the nonlinear Kerr effect in microring resonator 130 with respect to the laser light from fiber loop laser cavity 110 and fiber loop laser cavity 120 to generate the broadband optical frequency comb. Moreover, microring resonator 130 of microring resonator optical frequency comb generator 100 of embodiments works together with the optical bandpass filters and amplifiers in fiber loop laser cavities 110 and 120 to make the generated optical frequency comb stable and flexible. Accordingly, it should be appreciated that the microring resonator 130 of embodiments acts not only as a fine filter but also as the nonlinear element in the fiber loop laser cavities (e.g., fiber loop laser cavities 110 and 120).

The four wave mixing (FWM) effect occurs under the low-power pump situation in the microring resonator optical frequency generator structure of the multiple cavity configuration of embodiments herein. FWM is a process where laser light at three frequencies, $f_1$, $f_2$, and $f_3$, interact to produce light at a fourth frequency, $f_4$ (e.g., $f_4=f_1+f_2-f_3$). It should be appreciated that, if the three frequencies are part of a frequency comb, the fourth frequency is mathematically required to be part of the same frequency comb as the three frequencies. Starting with laser light at two or more equally spaced frequencies, this process can generate light at more and more different equally spaced frequencies (e.g., FWM laser light at two frequencies $f_1$ and $f_2$ can generate light at the new frequency $2f_1-f_2$). This light generated at the new frequencies would get gradually more intense, and light can subsequently cascade to more and more new frequencies on the same frequency comb. Accordingly, in operation according to embodiments of microring resonator optical frequency generator 100, laser light from both of fiber loop laser cavity 110 and 120 is stored in microring resonator 130 to cause the FWM effect to generate optical frequency combs from the stored light having an intensity above a four wave mixing threshold.

From the foregoing it can be seen that in operation of microring resonator optical frequency comb generator 100 of embodiments both the fiber loop laser cavities as well as the microring resonator generate one or more laser frequency elements (e.g., frequency elements 151, 152, and 153$a$-153$h$ of frequency comb 150 shown in FIG. 1B). The lasing frequencies are controlled according to embodiments by the optical bandpass filters embedded in the individual fiber loop laser cavities. The passbands of the optical bandpass filters of embodiments select the resonating modes of the microring resonator to provide lasing wavelengths (frequency elements) generated by the fiber loop laser cavities (e.g., passband 161 of optical amplifier 111 encompasses resonating mode 163$j$ to provide for oscillation in fiber loop laser cavity 110 to generate frequency element 151 and passband 162 of optical amplifier 121 encompasses resonating mode 163$k$ to provide for oscillation in fiber loop laser cavity 120 to generate frequency element 152). Accordingly, the passbands of the optical bandpass filters may be chosen to select the resonating modes of the microring resonator to provide more or fewer lasing wavelengths (frequency elements) generated by the fiber loop laser cavities. For example, the passbands of optical bandpass filters 111 and 121 may be chosen wider (e.g., wider than passbands 161 and 162) to select more resonating modes (e.g., resonating modes in addition to resonating modes 163$j$ and 163$k$) from microring resonator 130 to provide more lasing wavelengths (e.g., frequency elements in addition to frequency elements 151 and 152). In operation, the frequency elements generated by the fiber loop laser cavities (e.g., frequency elements 151 and 152) are mixed within the microring resonator to generate additional frequency elements (e.g., frequency elements 153$a$-153$h$) of the frequency comb (e.g., frequency comb 150) via the four-wave mixing effect.

The generated frequency comb may be output by microring resonator optical frequency comb generator 100, such as for use with respect to optical clocks, molecular and biological spectroscopy, astronomy, coherent optical communications, microwave photonics, signal processing, etc. For example, frequency comb 150 of FIG. 1B may be tapped and observed through an optical coupler (e.g., optical coupler 115 of FIG. 1A) in one or more of the fiber loop laser cavities.

As can be appreciated from the foregoing, a microring resonator optical frequency comb generator of embodiments of the present invention may include a first fiber loop laser cavity, a second symmetrical fiber loop laser cavity, and a high-Q microring resonator that is coupled into both of the first and second fiber loop laser cavities so that the laser light from both of the fiber laser cavities can be stored in the microring resonator to cause the four wave mixing effect to generate the optical frequency combs. The first fiber loop laser cavity of embodiments may include an optical amplifier, a polarization controller, an isolator, an optical bandpass filter, and an optical coupler for the output of the generated optical frequency comb signal. The second fiber loop laser cavity of embodiments may include an optical amplifier, a polarization controller, an isolator and an optical bandpass filter. The microring resonator of embodiments may include a resonant wavelength tuner.

Optical amplifiers of embodiments of the first and second fiber loop laser cavities may be configured as a gain medium to provide sustained energy for the laser light oscillation of the microring resonator optical frequency comb generator. The optical amplifiers of embodiments may, for example, comprise an Erbium-doped fiber amplifier (EDFA), an Ytterbium-doped fiber amplifier, a Raman amplifier, or a semiconductor optical amplifier. In operation according to embodiments, the power from each of the optical amplifiers can be controlled (e.g., reduced) to induce the FWM effect in the micro-cavity of the microring resonator for broadband optical frequency comb generation.

Polarization controllers of embodiments of the first and second fiber loop laser cavities may be configured to control the polarization state into the microring cavity of the microring resonator optical frequency comb generator. The microring resonator of embodiments herein is a polarization-sensitive device and thus a polarization controller may be disposed in in the fiber loop laser cavities in front of the microring resonator to provide the best polarization alignment. The polarization controllers of embodiments may, for example, comprise waveplates or controlled stress to the fiber disposed between an optical amplifier of the fiber loop laser cavity and a terminal of the microring resonator of the microring resonator optical frequency comb generator.

Isolators of the first and second fiber loop laser cavities may be configured to ensure light propagating in a single direction. Isolators of embodiments may be disposed at any positions in the fiber loop laser cavities to ensure light propagating in only one direction. The isolators of embodiments may, for example, comprise optical diodes disposed in the fiber loop laser cavities at a terminal of the microring resonator of the microring resonator optical frequency comb generator.

Optical bandpass filters of the first and second fiber loop laser cavities may be configured to select certain resonate modes of the microring resonator. For example, one resonating mode of the microring resonator can be chosen using a narrow bandpass filter in the first fiber loop laser cavity and another resonating mode of the microring resonator (adjacent or not adjacent) can be chosen using another narrow bandpass filter in the second fiber loop laser cavity (e.g., as shown in the illustration of FIG. 1B) to select single lasing modes for the fiber loop laser cavities having frequency element wavelengths corresponding to the respective chosen resonating modes. Alternatively, a group of resonating modes of the microring resonator can be chosen using a wider bandpass filter in the first fiber loop laser cavity and another group of resonating modes of the microring resonator modes may be chosen using a similarly wider bandpass filter in the second fiber loop laser cavity to select multiple lasing modes for the fiber loop laser cavities having frequency element wavelengths corresponding to the respective chosen groups of resonating modes. The optical bandpass filters of embodiments may comprise a tunable optical bandpass filter configuration, such as a tunable etalon filter. The optical bandpass filters of embodiments may, for example, be disposed between the optical amplifier and a terminal of the microring resonator of the fiber loop laser cavities (e.g., disposed between the optical amplifier and the optical coupler tap of embodiments of the first fiber loop laser cavity). The optical bandpass filter of embodiments is disposed at the input of the optical amplifier in the fiber loop cavity (i.e. between the drop port of the microring resonator and the input port of the optical amplifier in each loop) to select certain resonating modes just after light going through and filtered by the microring resonator. Moreover, disposing the optical bandpass filter at the input of the optical filter according to embodiments provides for maximum input power to the microring resonator (e.g., the output of the optical amplifier is not attenuated by the optical bandpass filter before being provided to the microring resonator terminal).

An optical coupler tap of the first fiber loop laser cavity may be configured as a tap to couple out a portion of the laser light as the microring resonator optical frequency comb generator system output. The optical coupler tap of embodiments may, for example, comprise an optical fiber fused to the fiber of the first fiber loop laser cavity such that the cores of the fibers are in contact.

A resonant wavelength tuner of the microring resonator may be configured to tune the response of the microring resonator. The resonant wavelength tuner of embodiments may, for example, comprise a thermal controller to tune the resonant wavelength of the microring resonator.

Microring resonator optical frequency comb generator configurations as described above may generate optical frequency combs cover the whole C band of optical communication window (i.e., 1530 nm to 1570 nm) according to embodiments herein. The passbands of the optical bandpass filters of the first and second fiber loop laser cavities may be enlarged or reduced to make different number of lasing modes oscillate in the fiber cavities in order to change the envelope shape of the generated optical frequency comb. Moreover, the wavelength channel spacing can be changed from tens to hundreds GHz discretely according to the parameters of the microring and parameters of the optical bandpass filters of the fiber loop laser cavities of embodiments. For example, the passband of the optical bandpass filters of the first and second fiber loop laser cavity may be tuned to different resonance peaks of the microring resonator (e.g., resonating modes shown in FIG. 1B) to generate optical frequency combs with a frequency spacing of an integer multiple of the free spectral range of the microring resonator. That is, according to embodiments of the invention, the channel spacing (e.g., channel spacing intervals 154a-154i of FIG. 1B) may be changed through changing the length of the microring resonator and thus changing the free spectral range (FSR) of the microring resonator. When the FSR of the microring resonator is fixed (e.g., a particular FSR is chosen), the particular channel spacing of the frequency comb provided by the microring resonator optical frequency comb generator of embodiments will be decided by the relative passband locations of the optical bandpass filters of the fiber loop laser cavities. Accordingly, the shape of the generated optical frequency comb provided by the microring resonator optical frequency comb generator of embodiments may be adjusted when optical bandpass filters of the fiber loop laser cavities with different passbands are used. Additionally, the relative passband locations of the optical bandpass filters and gain profile of the optical amplifiers can also affect the shape of the generated optical frequency comb.

Figure 2:
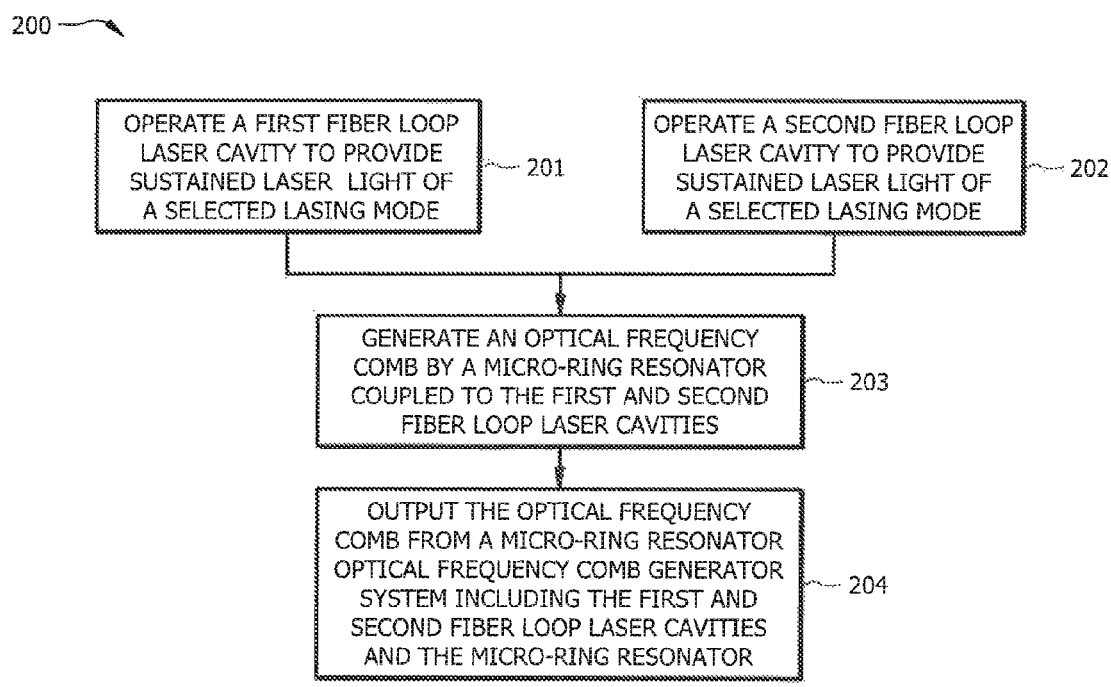
FIG. 2 shows a flow diagram illustrating operation of a microring resonator optical frequency comb generator according to embodiments of the present invention.

Directing attention to FIG. 2, a flow diagram showing operation of a microring resonator optical frequency comb generator, such as microring resonator optical frequency comb generator 100 of FIG. 1A, to generate an optical frequency comb according to embodiments herein is shown. In particular, flow 200 of the embodiment illustrated in FIG. 2 provides operation to generate an optical frequency comb via four wave mixing according to concepts of the present invention, wherein tunable frequency spacing and adjustable shape of the frequency comb may be provided.

At block 201 of the illustrated embodiment of flow 200, a first fiber loop laser cavity is operated to provide sustained energy for laser light oscillation in at least one selected resonating mode. For example, in operation according to embodiments laser light from at least one lasing mode of the first fiber loop laser cavity is generated, wherein the first fiber loop comprises a first optical amplifier configured to provide the sustained energy for laser light oscillation and a first optical bandpass filter configured to select at least one resonating mode of the microring resonator and correspondingly the at least one lasing mode of the first fiber loop laser cavity.

At block 202 of the illustrated embodiment of flow 200, a second fiber loop laser cavity is operated to provide sustained energy for laser light oscillation in at least one selected resonating mode. For example, in operation according to embodiments laser light from at least one lasing mode of the second fiber loop laser cavity is generated, wherein the second fiber loop comprises a second optical amplifier configured to provide the sustained energy for laser light oscillation and a second optical bandpass filter configured to select at least one resonating mode of the microring resonator and correspondingly the at least one lasing mode of the second fiber loop laser cavity. It should be appreciated that, because the fiber loop laser cavities of embodiments of a microring resonator optical frequency comb generator share the same microring resonator, the potential resonating modes for use with each fiber loop laser cavity are the same. However, in operation according to embodiments of the invention, each fiber loop laser cavity is configured to choose one or more of the resonating modes for generating different laser frequencies (e.g., frequency elements 151 and 152 of FIG. 1B) suitable for FWM by the microring resonator to generate the optical frequency combs.

Operation of the first and second fiber loop laser cavities in accordance with flow 200 of embodiments may comprise controlling the output power of the first and second optical amplifiers to sustain laser light energy at the same level within each of the fiber loop laser cavities. For example, the optical amplifiers of the fiber loop laser cavities are operated to provide laser light energy to the microring resonator at the same level from each fiber loop laser cavity to provide stable and strong four wave mixing effect for generating a flat and/or wide optical frequency comb.

Additionally or alternatively, operation of the first and second fiber loop laser cavities in accordance with flow 200 of embodiments may comprise tuning the passband of the optical bandpass filter of the first and/or second fiber loop laser cavity. For example, the passband of the optical bandpass filters of the first and second fiber loop laser cavities may be tuned to different resonance peaks of a microring resonator coupled thereto to generate optical frequency combs with a frequency spacing of an integer multiple of the free spectral range of the microring resonator. As another example, the passbands of the optical bandpass filters of the first and second fiber loop laser cavities may be enlarged or reduced to make different number of lasing modes oscillate in the fiber cavities in order to change the envelope shape of the generated optical frequency comb.

It should be appreciated that the first and/or second fiber loop laser cavities of embodiments may comprise polarization controllers. Accordingly, operation of the first and/or second fiber loop laser cavities in accordance with flow 200 of embodiments may comprise adjusting the respective polarization controller in the first and/or second fiber loop laser cavity to ensure the same polarization state into a microring resonator coupled thereto.

The embodiment of flow 200 illustrated in FIG. 2 shows blocks 201 and 202 operating in parallel. It should be appreciated, however, that operation of the first fiber loop laser cavity and the second fiber loop laser cavity need not be initiated simultaneously according to embodiments. For example, operation of either such fiber loop laser cavity may be initiated prior to operation of the other such fiber loop laser cavity. However, each of the first and second fiber loop laser cavities is operated concurrently for generation of and optic frequency comb according to embodiments.

At block 203 of the illustrated embodiment of flow 200, a microring resonator, coupled to the first fiber loop laser cavity and the second fiber loop laser cavity, generates an optical frequency comb. For example, the microring resonator of embodiments may comprise a high Q factor (e.g., Q factor greater than 1 million) operable to use laser light of the lasing mode(s) provided by the first and second fiber loop laser cavities and stored by the microring resonator having light intensity above a four wave mixing threshold to generate the optical frequency comb.

Operation of the microring resonator to generate the optical frequency comb in accordance with flow 200 of embodiments may comprise tuning the microring resonator. For example, the microring resonator may be tuned to change the resonance frequencies of the microring resonator. For example, changing the temperature of the microring resonator may be utilized to tune the microring resonator by shifting the resonating modes (e.g., resonating modes 163a-163aa of FIG. 1B) left or right, whereby all the wavelengths of the generated optical frequency comb will correspondingly be shifted left or right in the spectrum.

At block 204 of the illustrated embodiment of flow 200, a microring resonator optical frequency comb generator system, including the first and second fiber loop laser cavities and the microring resonator, outputs the generated optical frequency comb. For example, the generated optical frequency comb may be output from a tape of an optical coupler of either or both of the fiber loop laser cavities. The optical frequency comb of embodiments may be utilized for various applications, such as ultrafast accurate optical clocks, molecular spectroscopy, biological spectroscopy, astronomy, coherent optical communications, microwave photonics, signal processing in different domains, etc. Optical frequency combs provided by embodiments of the invention may, for example, be utilized in a commercial high capacity optical communication system as a multiple wavelength laser source. Moreover, optical frequency combs provided by embodiments of the invention may be utilized in scientific applications, such as by serving as frequency standard in metrology and synthesis and mode-locked laser for pump/probe sensing.

Having described configurations of a microring resonator optical frequency comb generator and its operation according to concepts of the present invention, it can be readily appreciated that a microring resonator optical frequency comb generator of embodiments differs from prior optical frequency comb generators at least in that two fiber loop laser cavities together with a microring cavity are utilized in implementations of an optical frequency comb generator herein. Moreover, the frequency spacing of the generated optical frequency comb based on the Kerr effect implemented according to embodiments of a microring resonator optical frequency comb generator of embodiments can be much larger than those based on femtosecond mode-locked laser or EOM in prior optical frequency comb generators. Further, unlike the schemes based on the Kerr effect in prior optical frequency comb generators using external direct laser pumping or one fiber loop main cavity, strict wavelength matching and thermal stabilization are not necessary in embodiments of a microring resonator optical frequency comb generator herein. Microring resonator optical frequency comb generators of embodiments of the present invention additionally or alternatively differ from prior optical frequency comb generators in the tuning and shaping abilities of the generated optical frequency combs. By changing the center wavelength of the optical bandpass filter in each fiber loop of an embodiment of a microring resonator optical frequency comb generator, the frequency spacing of the generated optical frequency comb can be tuned discretely based on the free spectral range (FSR) of the microring resonator. Moreover, by changing the bandwidth of the optical bandpass filter in each fiber loop of an embodiment of a microring resonator optical frequency comb generator, the shape of the generated optical frequency comb can be adjusted. Accordingly, microring resonator optical frequency comb generators of embodiments herein provide much better flexibility than those in prior implementations of optical frequency comb generators.

Operation of a microring resonator optical frequency comb generator configuration in accordance with the exemplary embodiment illustrated in FIG. 1A has been demonstrated in the laboratory. In a first experiment to demonstrate the operation of such a microring resonator optical frequency comb generator, a commercially available microring resonator having a free spectral range (FSR) of approximately 200 GHz was used to provide frequency spacing of the generated frequency comb of 200 GHz. Two commercially available erbium-doped fiber amplifiers (EDFAs) having the same gain level (e.g., ~15 dB) were used in the first experiment as the optical amplifiers in each fiber loop of the microring resonator optical frequency comb generator. A tunable optical bandpass filter with a passband of 1.2 nm was used as the optical bandpass filter in the first fiber loop and an optical bandpass filter having a fixed passband of 1.6 nm centered at 1560.8 nm was used as the optical bandpass filter in the second fiber loop of the microring resonator optical frequency comb generator of the first experiment. The output of the generated optical frequency comb was observed via an optical spectrum analyzer (OSA) from the tap port of a 1:99 coupler disposed in the first fiber loop.

Figure 3A:
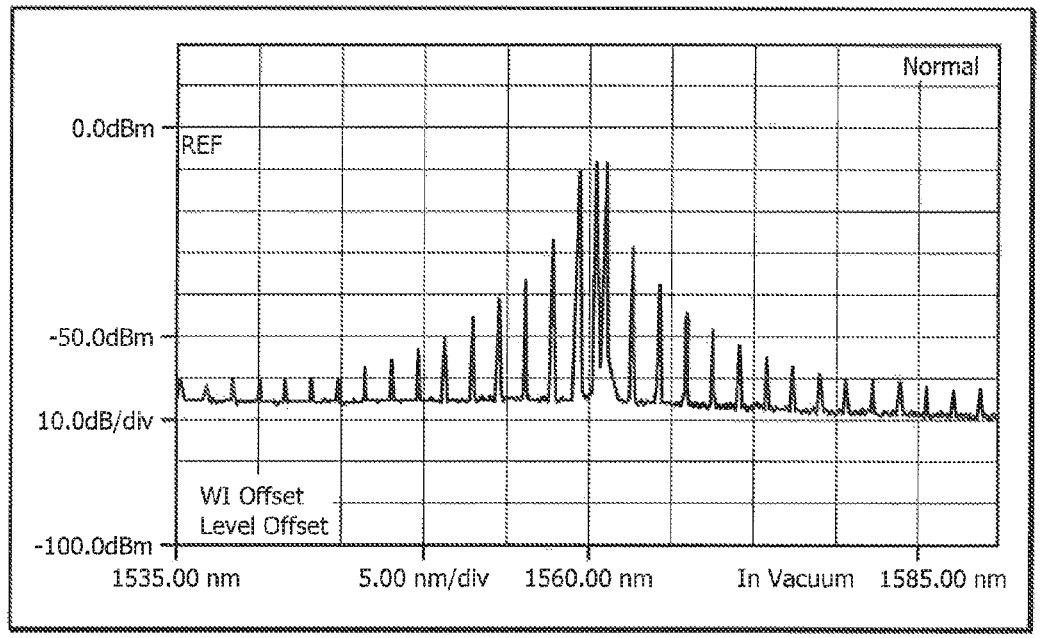
FIGS. 3A and 3B show the spectrum of optical frequency combs generated by a first experiment demonstrating operation of a microring resonator optical frequency comb generator according to embodiments of the present invention.

In operation of the microring resonator optical frequency comb generator of the first experiment, the tunable bandpass filter in the first fiber loop was initially tuned to approximately 1559 nm so that two wavelengths with one-FSR spacing were selected by each fiber loop to oscillate. The spectrum of the optical frequency comb generated by the first experiment based on FWM of the foregoing wavelengths is shown in FIG. 3A. In particular, FIG. 3A shows the spectrum of the generated optical frequency comb with a wavelength spacing of 200 GHz.

Figure 3B:
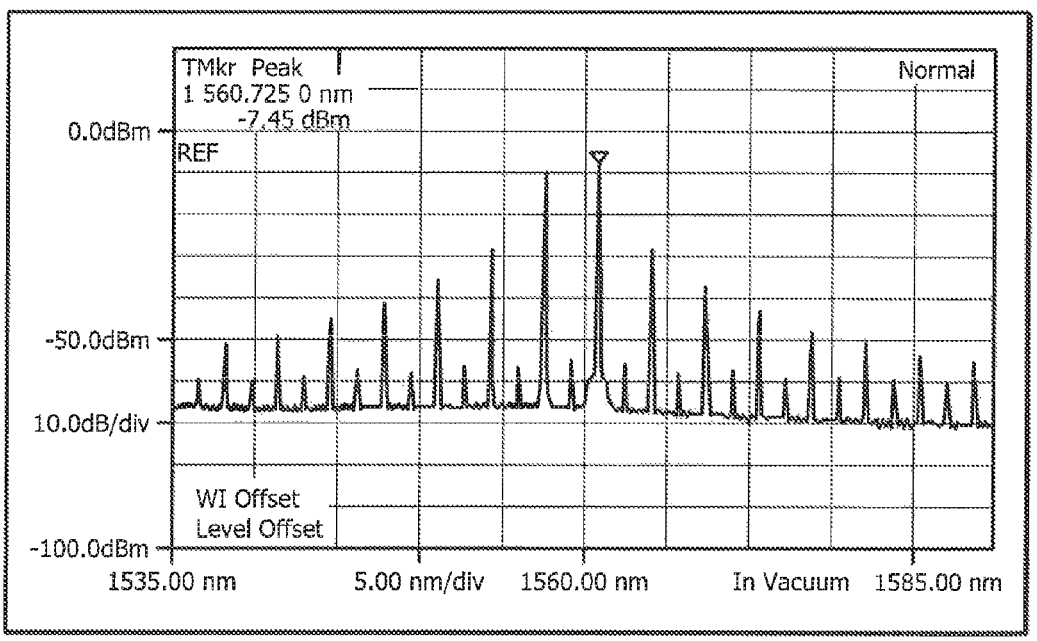

In operation of the microring resonator optical frequency comb generator of the first experiment, the center wavelength of the tunable bandpass filter was subsequently tuned left so that two wavelengths with two-FSR spacing are selected by each fiber loop to generate the optical frequency comb based on FWM. FIG. 3B shows the corresponding spectrum of the optical frequency comb generated by the first experiment based on FWM of these subsequent wavelengths. It can be seen in the graph of FIG. 3B that the frequency spacing of the generated optical frequency comb has doubled (as compared to the frequency spacing of FIG. 2A) to 400 GHz, and the bandwidth of the optical frequency comb has also become wider.

Figure 4A:
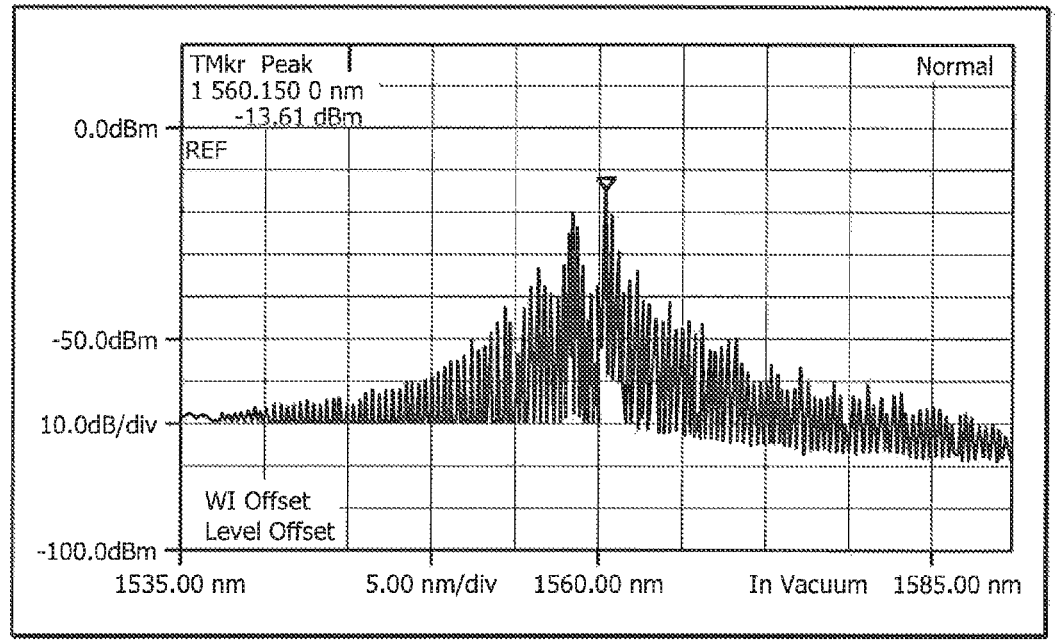
FIGS. 4A and 4B show the spectrum of optical frequency combs generated by a second experiment demonstrating operation of a microring resonator optical frequency comb generator according to embodiments of the present invention.
Figure 4B:
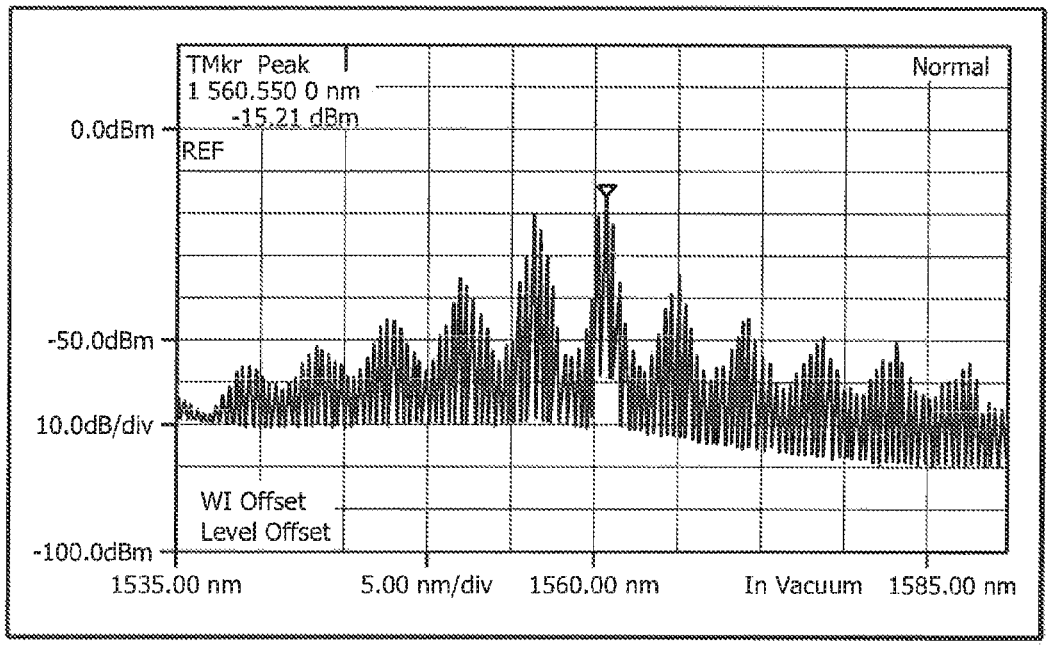

In a second experiment to demonstrate the operation of a microring resonator optical frequency comb generator configuration in accordance with the exemplary embodiment illustrated in FIG. 1A, a microring resonator with a 50-GHz FSR was used to provide frequency spacing of the generated frequency comb of 50 GHz. All the other components remain the same in the second experiment as in the first experiment. In operation of the microring resonator optical frequency comb generator in accordance with the second experiment it can be appreciated that more than one wavelengths are selected by each of the two optical bandpass filters in the first or second fiber loop. Moreover, FWM happens both inside the two bands and between them. FIG. 4A shows the spectrum of the generated optical frequency comb with a wavelength spacing of 50 GHz. FIG. 4B shows the spectrum of the generated optical frequency comb with an adjustable envelope shape. In particular, FIGS. 4A and 4B show the spectra of the generated optical frequency combs when the tunable bandpass filter in the first fiber loop is tuned to different wavelength position respectively. It can be seen from FIGS. 4A and 4B that through tuning the passband of the tunable optical filter the shape of the generated optical frequency comb can be changed, and the bandwidth of the optical frequency comb can also be extended.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A system for optical frequency comb generation, the system comprising:

a first fiber loop laser cavity;
a second fiber loop laser cavity, wherein the second fiber loop laser cavity comprises a different fiber loop than the first fiber loop laser cavity; and
a microring resonator coupled to the first fiber loop laser cavity and the second fiber loop laser cavity, wherein the microring resonator is configured to use laser light from both the first and second fiber loop laser cavities with four wave mixing effect to generate an optical frequency comb.

2. The system of claim 1, wherein the first fiber loop laser cavity comprises:
a first optical amplifier;
a first polarization controller;
a first isolator,
a first optical bandpass filter; and
a first tap coupler.

3. The system of claim 2, wherein the first optical amplifier comprises a gain medium configured to sustain energy for laser oscillation.

4. The system of claim 2, wherein the first optical amplifier comprises a semiconductor optical amplifier.

5. The system of claim 2, wherein the first optical amplifier comprises an amplifier selected from the group consisting of:
an Erbium-doped fiber amplifier (EDFA);
an Ytterbium-doped fiber amplifier, and
a Raman amplifier.

6. The system of claim 2, wherein the first polarization controller is configured to control polarization of laser light provided to the microring resonator by the first fiber loop laser cavity.

7. The system of claim 6, wherein the first polarization controller is disposed in the first fiber loop laser cavity between the first optical amplifier and a terminal coupling the first fiber loop laser cavity to the microring resonator.

8. The system of claim 2, wherein the first isolator is configured to cause laser light to propagate in the first fiber loop laser cavity in a single direction.

9. The system of claim 2, wherein the first optical bandpass filter is configured to select a lasing mode of the first fiber loop laser cavity.

10. The system of claim 9, wherein the first optical bandpass filter is disposed in the first fiber loop laser cavity between the first optical amplifier and the first tap coupler.

11. The system of claim 9, wherein the first optical bandpass filter is a tunable optical bandpass filter.

12. The system of claim 2, wherein first tap coupler is configured to provide output of generated optical frequency comb signals.

13. The system of claim 12, wherein the first tap coupler comprises an optical coupler disposed in the first fiber loop laser cavity to output at least a portion of laser light of the first fiber loop laser cavity as output of the system.

14. The system of claim 2, wherein the second fiber loop laser cavity comprises:
a second optical amplifier;
a second polarization controller,
a second isolator, and
a second optical bandpass filter.

15. The system of claim 1, wherein the microring resonator comprises a microring resonator configuration providing a quality factor, Q, value of more than one million.

16. The system of claim 1, wherein the microring resonator comprises two terminals for laser light input and two terminals for laser light output, wherein the first fiber loop laser cavity is coupled to a first input terminal of the two terminals for laser light input and a first output terminal of the two terminals for laser light output, and wherein the second fiber loop laser cavity is coupled to a second input terminal of the two terminals for laser light input and a second output terminal of the two terminals for laser light output ports.

17. The system of claim 1, wherein the microring resonator is a tunable microring resonator.

18. The system of claim 17, wherein the tunable microring resonator comprises a thermal controller configured to tune a response of the tunable microring resonator.

19. A method for generating an optical frequency comb, the method comprising:
operating a first fiber loop laser cavity to provide sustained laser light of a first selected lasing mode;
operating a second fiber loop laser cavity to provide sustained laser light of a second selected lasing mode, wherein the second fiber loop laser cavity comprises a different fiber loop than the first fiber loop laser cavity; and
generating an optical frequency comb using a microring resonator coupled to the first fiber loop laser cavity and the second fiber loop laser cavity, wherein the generating the optical frequency comb uses laser light within the microring resonator having an intensity above a four wave mixing threshold to provide four wave mixing by the microring resonator.

20. The method of claim 19, wherein the operating the first fiber loop laser cavity and operating the second fiber loop laser cavity comprise:
controlling an output power of a first optical amplifier disposed in the first fiber loop laser cavity and an output power of a second optical amplifier disposed in the second fiber loop laser cavity to provide laser light within the first and second fiber loop laser cavities having the same level.

21. The method of claim 19, wherein the operating the first fiber loop laser cavity and operating the second fiber loop laser cavity comprise:
adjusting a first polarization controller disposed in the first fiber loop laser cavity and a second polarization controller disposed in the second fiber loop laser cavity to provide the same polarization of laser light to the microring resonator.

22. The method of claim 19, wherein the operating the first fiber loop laser cavity and operating the second fiber loop laser cavity comprise:
tuning a passband of a first optical bandpass filter disposed in the first fiber loop laser cavity and a passband of a second optical bandpass filter disposed in the second fiber loop laser cavity to different resonance peaks of the microring resonator to generate an optical frequency comb with a frequency spacing of an integer multiple of a free spectral range of the microring resonator.

23. The method of claim 19, wherein the operating the first fiber loop laser cavity, operating the second fiber loop laser cavity, and generating the optical frequency comb provides tunable frequency spacing and adjustable shape of the generated optical frequency comb.

24. The method of claim 23, wherein the operating the first fiber loop laser cavity and operating the second fiber loop laser cavity comprise:
changing a bandwidth of a first optical bandpass filter disposed in the first fiber loop laser cavity and a bandwidth of a second optical bandpass filter disposed in the second fiber loop laser cavity to select a number of lasing modes in the first and second fiber loop laser cavities.

25. The method of claim 24, wherein the changing a bandwidth of the first optical bandpass filter and the bandwidth of the second optical bandpass filter is changed to control an envelope shape of the generated optical frequency comb.

26. The method of claim 23, wherein the operating the first fiber loop laser cavity comprises:
tuning a passband of a first optical bandpass filter disposed in the first fiber loop laser cavity for changing a frequency spacing of the generated optical frequency comb.

27. The method of claim 19, further comprising:
tuning the microring resonator to change resonance frequencies of the microring resonator.

28. The method of claim 19, wherein the first fiber loop laser cavity includes a first optical amplifier configured to provide sustained energy for laser light oscillation in the first fiber loop laser cavity and a first optical bandpass filter configured to select the first lasing mode, wherein the second fiber loop laser cavity includes a second optical amplifier configured to provide sustained energy for laser light oscillation in the second fiber loop laser cavity and a second optical bandpass filter configured to select the second lasing mode, and wherein the microring resonator comprises a microring resonator configuration providing a quality factor, Q, value of more than one million.

29. An optical frequency comb generator comprising:
a first fiber loop laser cavity having a first optical amplifier, a first polarization controller, a first isolator, and a first optical bandpass filter; and
a second fiber loop laser cavity having a second optical amplifier, a second polarization controller, a second isolator, and a second optical bandpass filter, wherein the second fiber loop laser cavity comprises a different fiber loon than the first fiber boo laser cavity; and
a microring resonator coupled to the first and second fiber loop laser cavities and configured to store laser light from both the first and second fiber loop laser cavities and utilize four wave mixing effect with respect to the laser light to generate an optical frequency comb.

30. The optical frequency comb generator of claim 29, wherein the microring resonator comprises a microring resonator configuration providing a quality factor, Q, value of more than one million.

31. The optical frequency comb generator of claim 29, wherein the first optical bandpass filter is a tunable optical bandpass filter, wherein the microring resonator comprises a thermal controller configured to tune a response of the microring resonator.

32. The optical frequency comb generator 29, wherein the first fiber loop laser cavity further has a first tap coupler configured to output the generated optical frequency comb, and wherein the first fiber loop laser cavity and the second fiber loop laser cavity are symmetrical with respect to the microring resonator except for an absence of a tap coupler in the second fiber loop laser cavity.

* * * * *

UNITED STATES PATENT AND TRADEMARK OFFICE
CERTIFICATE OF CORRECTION

PATENT NO. : 9,891,500 B1
APPLICATION NO. : 15/399321
DATED : February 13, 2018
INVENTOR(S) : Sai Tak Chu et al.

Page 1 of 1

It is certified that error appears in the above-identified patent and that said Letters Patent is hereby corrected as shown below:

In the Claims

At Column 13, Claim number 2, Line number 15, delete "a first isolator," and replace with --a first isolator;--.
At Column 13, Claim number 5, Line number 27, delete "an Ytterbium-doped fiber amplifier," and replace with --an Ytterbium-doped fiber amplifier;--.
At Column 13, Claim number 14, Line number 58, delete "a second polarization controller," and replace with --a second polarization controller;--.
At Column 13, Claim number 14, Line number 59, delete "a second isolator," and replace with --a second isolator;--.
At Column 16, Claim number 29, Line number 9, delete "fiber loon than the first fiber boo laser cavity" and replace with --fiber loop than the first fiber loop laser cavity--.
At Column 16, Claim number 32, Line number 23, delete "The optical frequency comb generator 29" and replace with --The optical frequency comb generator of claim 29--.

Signed and Sealed this
Tenth Day of April, 2018

Andrei Iancu
*Director of the United States Patent and Trademark Office*